United States Patent
Penumatcha et al.

(10) Patent No.: US 11,646,374 B2
(45) Date of Patent: May 9, 2023

(54) FERROELECTRIC TRANSISTORS TO STORE MULTIPLE STATES OF RESISTANCES FOR MEMORY CELLS

(71) Applicant: Intel Corporation, Santa Clara, CA (US)

(72) Inventors: Ashish Verma Penumatcha, Hillsboro, OR (US); Tanay Gosavi, Hillsboro, OR (US); Uygar Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 984 days.

(21) Appl. No.: 16/232,615

(22) Filed: Dec. 26, 2018

(65) Prior Publication Data

US 2020/0212224 A1 Jul. 2, 2020

(51) Int. Cl.
| | | |
|---|---|---|
| *H01L 29/78* | (2006.01) | |
| *H01L 29/51* | (2006.01) | |
| *H01L 29/66* | (2006.01) | |
| *G11C 11/22* | (2006.01) | |
| *H01L 29/417* | (2006.01) | |
| *H01L 21/28* | (2006.01) | |

(52) U.S. Cl.
CPC ...... *H01L 29/78391* (2014.09); *G11C 11/223* (2013.01); *G11C 11/2275* (2013.01); *H01L 29/40111* (2019.08); *H01L 29/41725* (2013.01); *H01L 29/516* (2013.01); *H01L 29/517* (2013.01); *H01L 29/6684* (2013.01)

(58) Field of Classification Search
CPC ......... H01L 29/78391; H01L 29/40111; H01L 29/41725; H01L 29/516; H01L 29/517; H01L 29/6684; H01L 27/1159; G11C 11/223; G11C 11/2275
See application file for complete search history.

(56) References Cited

U.S. PATENT DOCUMENTS

| | | | |
|---|---|---|---|
| 2004/0089854 A1* | 5/2004 | Chen | H01L 21/31691 |
| | | | 252/570 |
| 2010/0244113 A1* | 9/2010 | Rieh | H01L 29/93 |
| | | | 257/E21.364 |
| 2018/0006129 A1* | 1/2018 | Xing | H01L 29/6684 |
| 2018/0114560 A1* | 4/2018 | Kim | H01L 29/78391 |
| 2019/0057971 A1* | 2/2019 | Tsukamoto | H01L 21/0228 |
| 2019/0131458 A1* | 5/2019 | Yoo | H01L 45/04 |
| 2020/0066755 A1* | 2/2020 | Han | H01L 27/2463 |
| 2020/0243549 A1* | 7/2020 | Jiang | G11C 11/22 |

* cited by examiner

*Primary Examiner* — S M Sohel Imtiaz
(74) *Attorney, Agent, or Firm* — Schwabe, Williamson & Wyatt, P.C.

(57) ABSTRACT

Embodiments herein describe techniques for a semiconductor device including a gate stack with a ferroelectric-oxide layer above a channel layer and in contact with the channel layer, and a top electrode above the ferroelectric-oxide layer. The ferroelectric-oxide layer includes a domain wall between an area under a nucleation point of the top electrode and above a separation line of the channel layer between an ON state portion and an OFF state portion of the channel layer. A resistance between a source electrode and a drain electrode is modulated in a range between a first resistance value and a second resistance value, dependent on a position of the domain wall within the ferroelectric-oxide layer, a position of the ON state portion of the channel layer, and a position of the OFF state portion of the channel layer. Other embodiments may be described and/or claimed.

25 Claims, 10 Drawing Sheets

FERROELECTRIC TRANSISTORS TO STORE MULTIPLE STATES OF RESISTANCES FOR MEMORY CELLS

FIELD

Embodiments of the present disclosure generally relate to the field of integrated circuits, and more particularly, to memory devices.

BACKGROUND

An integrated circuit (IC) may include many components, e.g., transistors, resistors, capacitors, diodes, formed on a semiconductor substrate. In addition, ICs may often include one or more types of memory devices, such as a memory array including multiple memory cells. There is a demand for more efficient memory devices to serve many current applications, such as deep-learning, image and video processing or recognition, deep neural network, natural language processing, or neuromorphic applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
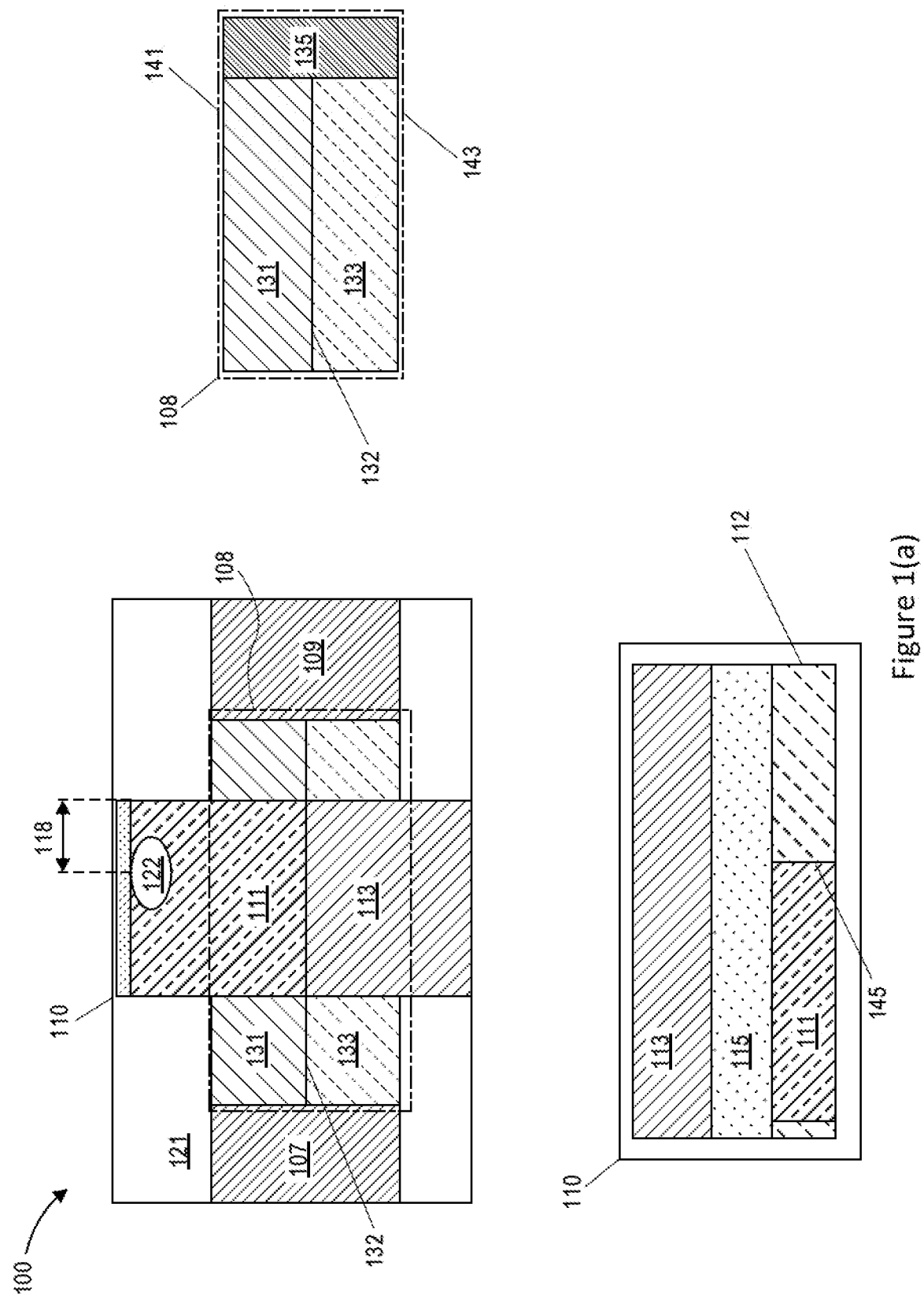
FIGS. 1(a)-1(d) schematically illustrate diagrams in top views and cross-section views of a semiconductor device having a domain wall within a ferroelectric-oxide layer of a gate stack to store multiple states of resistances, in accordance with some embodiments.

Memory devices are important parts of integrated circuits (IC) and modern electronic devices. A memory array may include a plurality of memory cells, where a memory cell may store information by various physical forms, e.g., capacitances, voltages, currents, or resistances. For example, a memory cell may include a selector to control a capacitor as a storage cell to store charge, resulting in a 1T1C (one transistor, one capacitor) architecture for the memory cell. Alternatively, a memory cell may include a fuse element or an antifuse element to store a binary digital value 0 or 1 by different resistance values of the fuse element or an antifuse element. However, there is a demand for memory devices more efficient than those conventional memory devices to serve many current applications, such as deep-learning, image and video processing or recognition, deep neural network, natural language processing, or neuromorphic applications.

Embodiments herein may include metal-oxide-semiconductor field-effect transistors (MOSFET) to store information in multiple states similar to an analog fashion, resulting in high-density multi-level memory devices. Instead of storing a binary or digital value 0 or 1 by conventional memory cells, e.g., an 1T1C storage cell, a fuse element, or an antifuse element, a ferroelectric transistor may function as a storage cell to store multiple states of resistances. Multiple resistances between a range of resistance values may be stored by a ferroelectric transistor to represent a real number of finite length within a numerical range. Hence, a ferroelectric transistor used as a storage cell may be more area efficient and consume lower power compared to other conventional memory cells. In addition, computing devices employing ferroelectric transistors as storage cells may have improved performance. For example, ferroelectric transistors used as storage cells in a deep neural network architecture may store the weights in neuromorphic applications, so that the systems may match the performance of a human at tasks such as language processing and image recognition.

In detail, in embodiments, a ferroelectric transistor may include a gate stack above a channel layer, where the gate stack includes a ferroelectric-oxide layer above the channel layer and in contact with the channel layer, and a top electrode above the ferroelectric-oxide layer. A domain wall may be generated within the ferroelectric-oxide layer by a programming voltage pulse applied to the top electrode. The domain wall may be positioned in various locations within the ferroelectric-oxide layer. A resistance between a source electrode and a drain electrode of the ferroelectric transistor is modulated in a range between a first resistance value and a second resistance value, dependent on the position of the domain wall within the ferroelectric-oxide layer of the gate stack. The resistance between the source electrode and the drain electrode may be read by some read-circuitry and sensing schemes to convert the resistance values into a current or voltage signals to be integrated into operations of the IC.

Embodiments herein may present a semiconductor device. The semiconductor device includes a channel layer above a bottom electrode, and a gate stack above the channel layer. The channel layer includes a first portion, and a second portion separated from the first portion by a separation line in a horizontal direction from a source electrode to a drain electrode. The first portion is in an ON state, while the second portion is in an OFF state. The gate stack includes a ferroelectric-oxide layer above the channel layer and in contact with the channel layer, and a top electrode above the ferroelectric-oxide layer. The top electrode includes a nucleation point. The ferroelectric-oxide layer includes a domain wall between an area under the nucleation point of the top electrode and above the separation line of the channel layer, and over the first portion of the channel layer. A resistance between the source electrode and the drain electrode is modulated in a range between a first resistance value and a second resistance value, dependent on a position of the domain wall within the ferroelectric-oxide layer of the gate stack, a position of the first portion of the channel layer, and a position of the second portion of the channel layer.

Embodiments herein may present a method for forming a semiconductor device. The method may include forming a bottom electrode; forming a channel layer above the bottom electrode; and forming a gate stack above the channel layer. The gate stack includes a ferroelectric-oxide layer above the channel layer and in contact with the channel layer, and a top electrode above the ferroelectric-oxide layer. The method further includes forming a via above and in contact with the top electrode at a nucleation point of the top electrode; and forming a gate contact above and in contact with the via. In addition, the method includes forming a source electrode and a drain electrode in contact with the channel layer. A domain wall within the ferroelectric-oxide layer is to be generated by a programming voltage pulse applied to the gate contact coupled to the top electrode through the via, while the source electrode, the drain electrode, and the bottom electrode are grounded. The channel layer includes a first portion, and a second portion separated from the first portion by a separation line in a horizontal direction from the source electrode to the drain electrode. The first portion of the channel layer is under the domain wall within the ferroelectric-oxide layer, and is in an ON state. The second portion of the channel layer is not overlapped with the domain wall, and is in an OFF state.

Embodiments herein may present a computing device, which may include a circuit board, and a memory device coupled to the circuit board and including a memory array. The memory array includes a plurality of memory cells. A memory cell of the plurality of memory cells includes a ferroelectric transistor. The ferroelectric transistor includes a channel layer above a bottom electrode, and a gate stack above the channel layer. The channel layer includes a first portion, and a second portion separated from the first portion by a separation line in a horizontal direction from a source electrode to a drain electrode. The first portion is in an ON state, while the second portion is in an OFF state. The gate stack includes a ferroelectric-oxide layer above the channel layer and in contact with the channel layer, and a top electrode above the ferroelectric-oxide layer. The top electrode includes a nucleation point. The ferroelectric-oxide layer includes a domain wall between an area under the nucleation point of the top electrode and above the separation line of the channel layer, and over the first portion of the channel layer. A resistance between the source electrode and the drain electrode is modulated in a range between a first resistance value and a second resistance value, dependent on a position of the domain wall within the ferroelectric-oxide layer of the gate stack, a position of the first portion of the channel layer, and a position of the second portion of the channel layer.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Front-end-of-line (FEOL) semiconductor processing and structures may refer to a first portion of integrated circuit (IC) fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin-film transistor (TFT) is a kind of field-effect transistor formed at BEOL and including a channel layer, a gate electrode, and source and drain electrodes, over a supporting but non-conducting substrate.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 1(a)-1(d) schematically illustrate diagrams in top views and cross-section views of a semiconductor device 100 having a domain wall 111 within a ferroelectric-oxide layer 112 of a gate stack 110 to store multiple states of resistances, in accordance with some embodiments. For clarity, features of the semiconductor device 100, the domain wall 111, the ferroelectric-oxide layer 112, and the gate stack 110, may be described below as examples for understanding an example semiconductor device having a domain wall within a ferroelectric-oxide layer of a gate stack to store multiple states of resistances. It is to be understood that there may be more or fewer components within the semiconductor device 100, the domain wall 111, the ferroelectric-oxide layer 112, and the gate stack 110. Further, it is to be understood that one or more of the components within a semiconductor device having a domain wall within a ferroelectric-oxide layer of a gate stack to store multiple states of resistances, may include additional and/or varying features from the description below, and may include any device that one having ordinary skill in the art would consider and/or refer to as a semiconductor device having a domain wall within a ferroelectric-oxide layer of a gate stack to store multiple states of resistances.

In embodiments, as shown in FIG. 1(a), the semiconductor device 100 includes a bottom electrode 121, a channel layer 108 above the bottom electrode 121, and the gate stack 110 above the channel layer 108, a source electrode 107 in contact with the channel layer 108, and a drain electrode 109 in contact with the channel layer 108. The gate stack 110 includes the ferroelectric-oxide layer 112 above the channel layer 108 and in contact with the channel layer 108, and a top electrode 113 above the ferroelectric-oxide layer 112. The ferroelectric-oxide layer 112 includes the domain wall 111. The top electrode 113 includes a nucleation point 122. The nucleation point 122 may be located at one end of the top electrode 113, where a distance 118 of the nucleation point to an edge of the top electrode 113 is about less than or equal to 5% of a length of the top electrode 113.

In embodiments, there may be an optional dielectric oxide layer 115 above the ferroelectric-oxide layer 112 and below the top electrode 113. In some other embodiments, the dielectric oxide layer 115 may not present, and the gate stack 110 includes only the ferroelectric-oxide layer 112 and the top electrode 113. In addition, the dielectric oxide layer 115 may be located in different positions. For example, the dielectric oxide layer 115 may be in contact with the channel layer 108, while the ferroelectric-oxide layer 112 and the top electrode 113 are above the dielectric oxide layer 115.

Figure 1B:
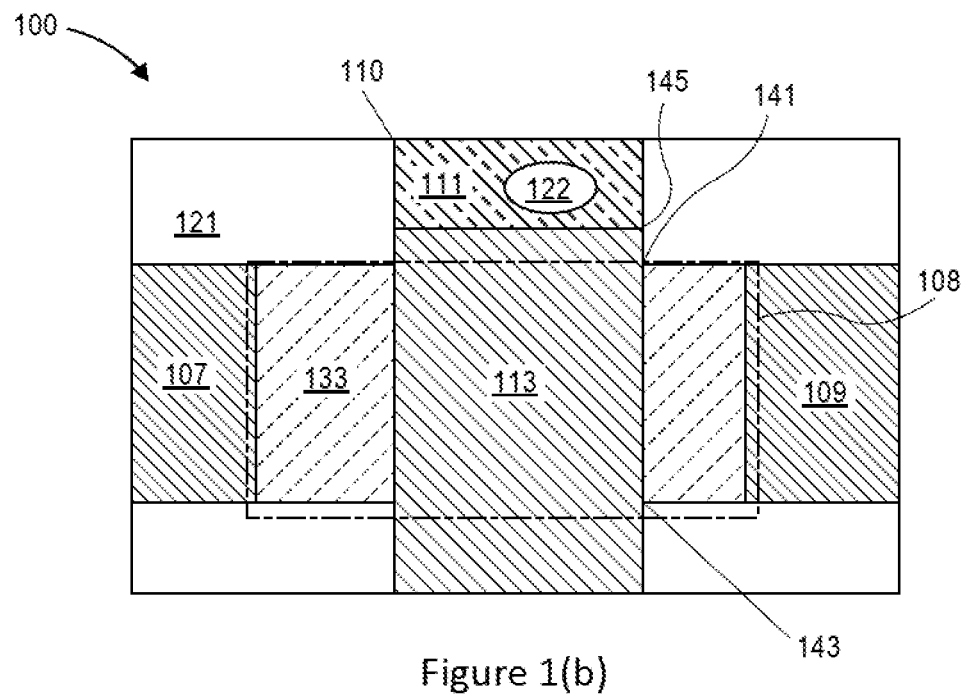
Figure 1C:
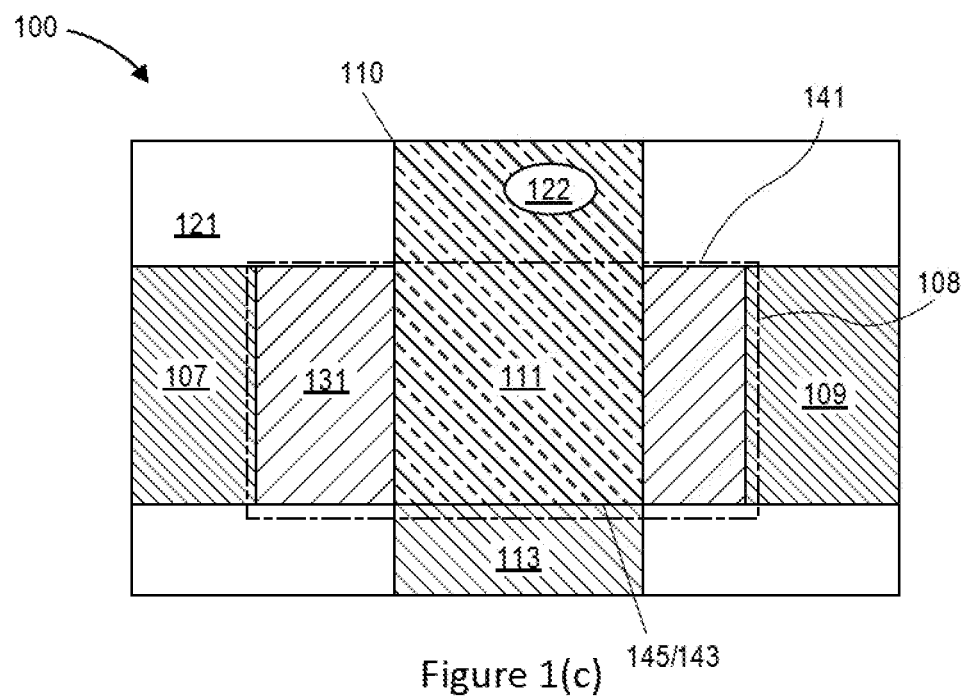

In embodiments, the channel layer 108 includes a first portion 131, and a second portion 133 separated from the first portion 131 by a separation line 132 in a horizontal direction from the source electrode 107 to the drain electrode 109. The separation line 132 is also between a boundary 141 and a boundary 143 of the channel layer 108. The channel layer 108 may be defined in the area by the source electrode 107, the drain electrode 109, the boundary 141, and the boundary 143. The first portion 131 is in an ON state, while the second portion 133 is in an OFF state. In some embodiments, the first portion 131 may be empty, and the second portion 133 may occupy the entire channel layer 108 to be in the OFF state, as shown in FIG. 1(b). In some other embodiments, the second portion 133 may be empty, and the first portion 131 may occupy the entire channel layer 108 to be in the ON state, as shown in FIG. 1(c). In addition, the channel layer 108 may optionally include a portion 135, which may always be in the ON state. The portion 135 may include additional doping and function as an extension as the source electrode 107 or the drain electrode 109. In some other embodiments, the portion 135 may not exist.

In embodiments, the ferroelectric-oxide layer 112 includes the domain wall 111 between an area under the nucleation point 122 of the top electrode 113 and above the separation line 132 of the channel layer 108. The domain wall 111 may have a boundary 145. The domain wall 111 is also over the first portion 131 of the channel layer 108, where the boundary 145 overlaps with the separation line 132 in the channel layer 108. A distance between the boundary 145 of the domain wall 111, which overlaps with the separation line 132, and the boundary 141 of the channel layer 108, may be referred to as a displacement of the domain wall 111 at the channel layer 108. The domain wall 111, which is between the area under the nucleation point 122 of the top electrode 113 and above the separation line 132 of the channel layer 108, divides the ferroelectric-oxide layer 112 into two areas or two domains. The domain wall 111 is a first domain of the ferroelectric-oxide layer 112 and the rest of the ferroelectric-oxide layer 112 forms another domain.

Figure 1D:
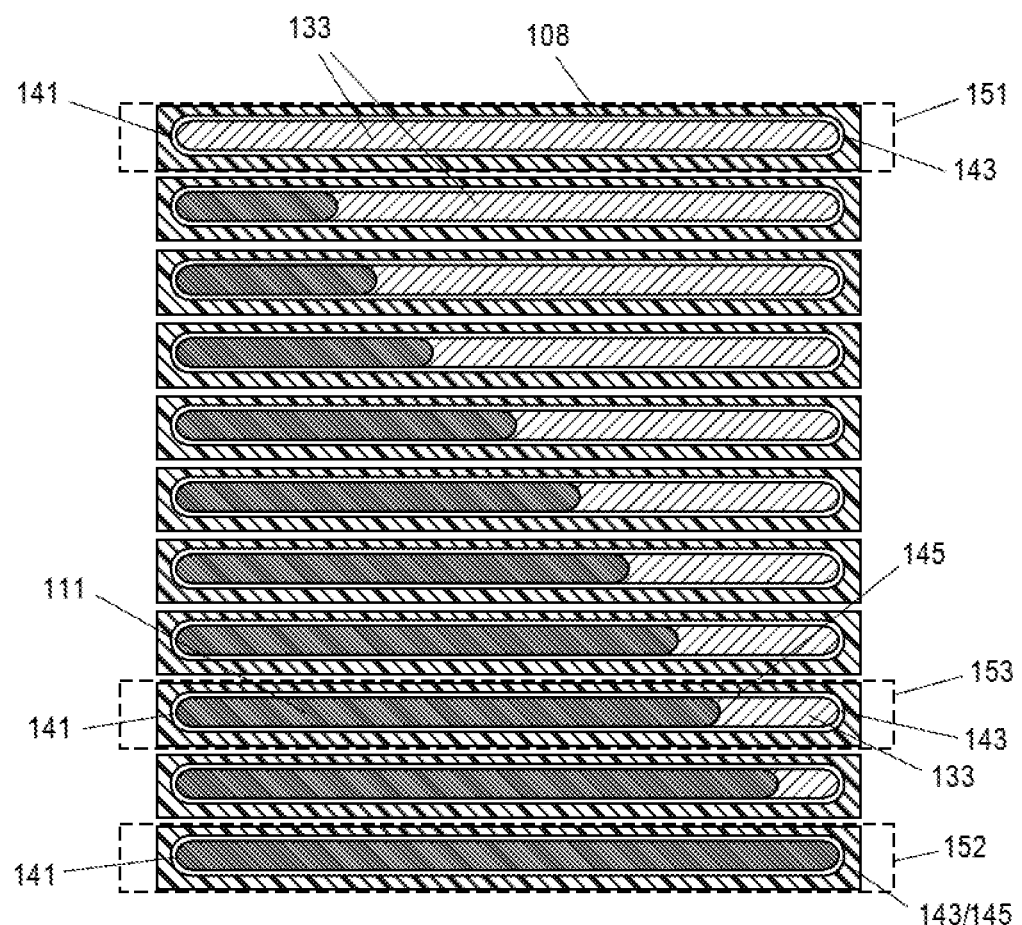

As further showing in more details in FIGS. 1(b)-1(d), the domain wall 111 may be located in various positions. The location of the domain wall 111 may determine a resistance between the source electrode 107 and the drain electrode 109. In detail, a resistance between the source electrode 107 and the drain electrode 109 is modulated in a range between a first resistance value and a second resistance value, dependent on a position of the domain wall 111 within the ferroelectric-oxide layer 112 of the gate stack 110, a position of the first portion 131 of the channel layer 108, and a position of the second portion 133 of the channel layer 108.

In embodiments, as shown in FIG. 1(b), the resistance between the source electrode 107 and the drain electrode 109 may be the highest when the second portion 133 occupies the entire channel layer 108 to be in the OFF state. For example, a resistance between the source electrode 107 and the drain electrode 109 may be about $10^9$ ohms/um to about $10*10^9$ ohms/um when the second portion 133 occupies the entire channel layer 108 to be in the OFF state. The resistance value herein in the range of $10^9$ ohms/um to about $10*10^9$ is provided in a normalized resistance value with respect to the length of the separation line 132, which is also a distance between the source electrode 107 and the drain electrode 109. Resistance values may be provided in other formats as well. In such a case, a shadow of the boundary 145 of the domain wall 111 may be outside the channel layer 108. The domain wall 111 does not overlap with the channel layer 108.

In embodiments, as shown in FIG. 1(c), the resistance between the source electrode 107 and the drain electrode 109 may be the lowest when the first portion 131 may occupy the entire channel layer 108 to be in the ON state. For example, a resistance between the source electrode 107 and the drain electrode 109 may be about 100 ohms/um to about 1000 ohms/um, when the first portion 131 occupies the entire channel layer 108 to be in the ON state. In such a case, the domain wall 111 entirely covers the channel layer 108 and the first portion 131, and a shadow of the boundary 145 of the domain wall 111 overlaps with the boundary 143 of the channel layer 108.

In embodiments, as shown in FIG. 1(d), for the case 151, the domain wall 111, not shown, may be located in any position outside the boundary 141 of the channel layer 108, which corresponds to the embodiments shown in FIG. 1(b). A first resistance value, which may be the highest resistance value, may exist between the source electrode 107 and the drain electrode 109 for the case 151. Alternatively, for the case 152, the boundary 145 of the domain wall 111 may overlap with the boundary 143 of the channel layer 108, which corresponds to the embodiments shown in FIG. 1(c). A second resistance value, which may be the lowest resistance value, may exist between the source electrode 107 and the drain electrode 109 for the case 152.

In addition, as shown for the case 153, the boundary 145 of the domain wall 111 may be located in any position between the boundary 141 and the boundary 143 of the channel layer 108. Accordingly, a resistance between the source electrode 107 and the drain electrode 109 may be modulated in a range between the first resistance value for the case 151, and the second resistance value for the case 152. Since the boundary 145 of the domain wall 111 may be located in any position between the boundary 141 and the boundary 143 of the channel layer 108, the resistance value between the source electrode 107 and the drain electrode 109 may form a continuous range between the first resistance value and the second resistance value, similar to an analog fashion. As a result, the semiconductor device 100 having the domain wall 111 within a ferroelectric-oxide layer 112 may store multiple states of resistances to represent a real number of finite length within a numerical range.

The channel layer 108 shown above has a rectangular shape. Other embodiments may have the channel layer 108 in a circular shape, a triangular shape, a square shape, or a polygon shape. In some embodiments, the channel layer 108 includes multiple fins, nanowires, or nanoribbons. A fin may be in an ON state or an OFF state. Accordingly, the first portion 131 or the second portion 133 of the channel layer 108 may include one or more fins. Therefore, the resistance between the source electrode 107 and the drain electrode 109 may change in terms of a unit of resistance for a fin between the source electrode 107 and the drain electrode 109. As a result, the resistance may form a stepwise function rather than a continuous function.

In embodiments, the ferroelectric-oxide layer 112 may include includes Pb, Zr, Ti, Ba, Sr, or Hf. The dielectric oxide layer 115 may include $SiO_2$, $Al_2O_3$, or $HfO_2$. The bottom electrode 121 or the top electrode 113 may include $SrRuO_3$, Pt, W, Ru, Co, TiN, Ta, TaN, Cu, Cr, Mo, or Pd. The source electrode 107 or the drain electrode 109 includes Ti, W, molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO. In embodiments, there may be other components, e.g., a gate dielectric layer, a spacer, not shown.

In some embodiments, the bottom electrode 121 may be a substrate, e.g., a silicon substrate, a glass substrate, a metal substrate, a substrate including and $SiO_2$, or a plastic substrate. In some other embodiments, the bottom electrode 121 may be above a metal layer, and within an interconnect structure above a substrate. When the bottom electrode 121 is above a metal layer, the channel layer 108 may include a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Figure 2B:
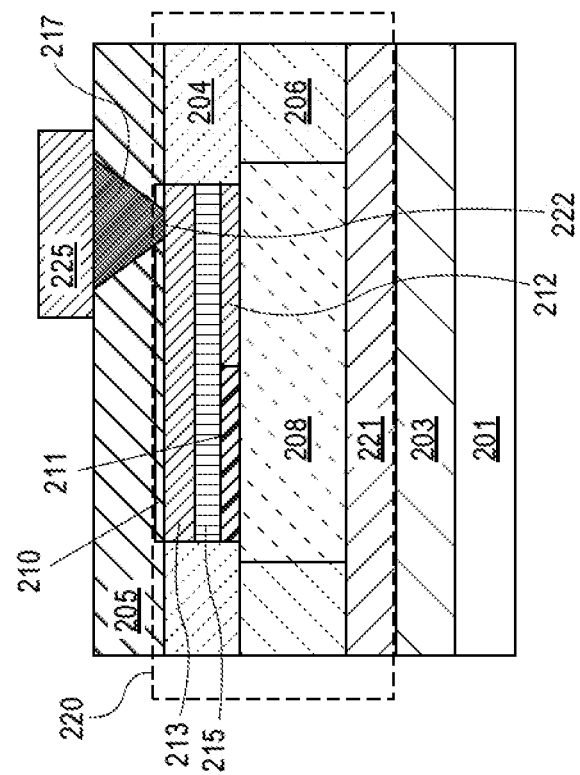
FIGS. 2(a)-2(e) schematically illustrate diagrams in top views and cross-section views of a semiconductor device having a domain wall within a ferroelectric-oxide layer of a gate stack to store multiple states of resistances, in accordance with some embodiments.
Figure 2A:
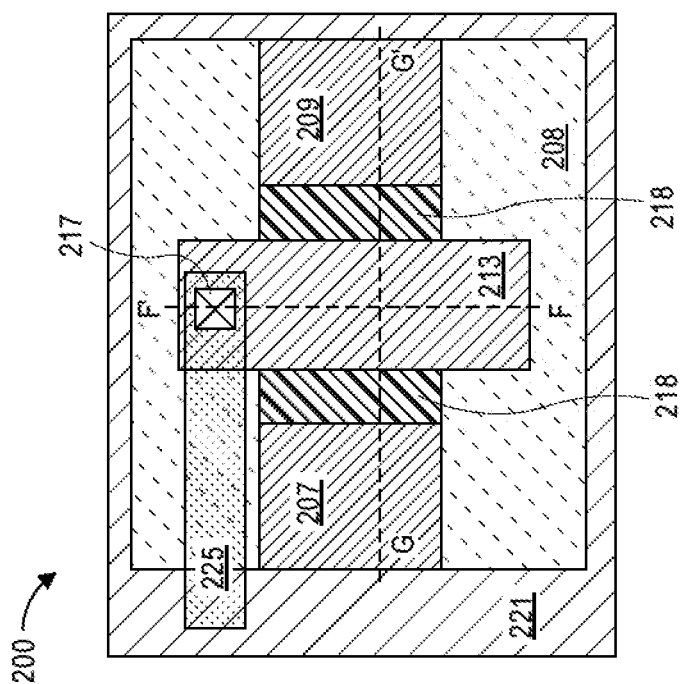
Figure 2C:
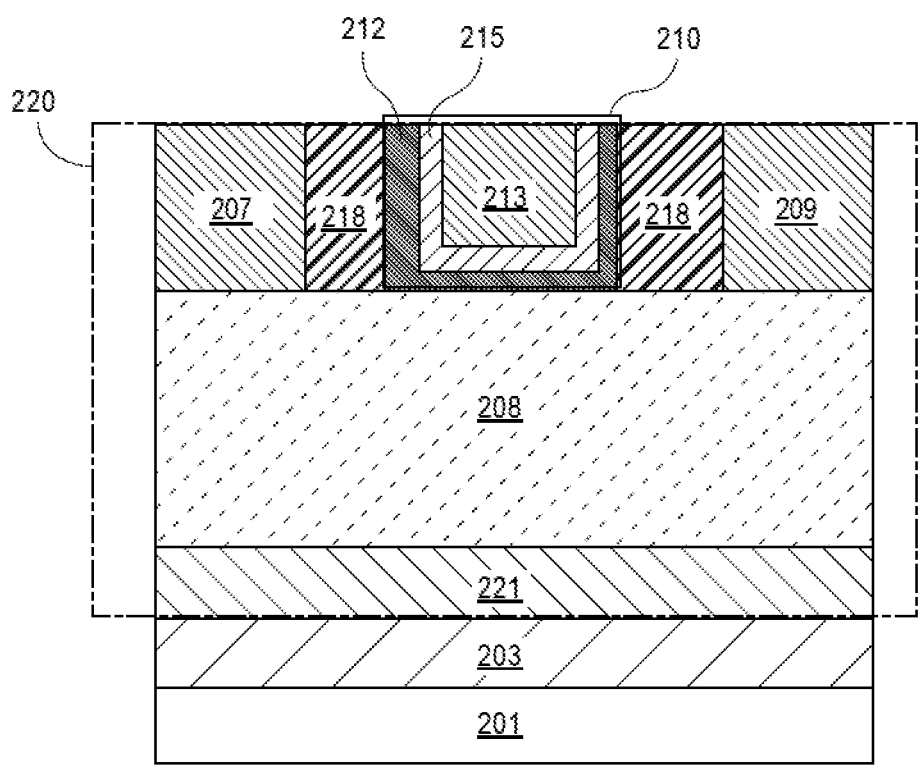

FIGS. 2(a)-2(e) schematically illustrate diagrams in top views and cross-section views of a semiconductor device 220 having a domain wall 211 within a ferroelectric-oxide layer 212 of a gate stack 210 to store multiple states of resistances, in accordance with some embodiments. The semiconductor device 220 may be an example of the semiconductor device 100 as shown in FIGS. 1(a)-1(d). In addition, the semiconductor device 220 may be a part of a semiconductor device 200, which may be a ferroelectric transistor. FIG. 2(a) shows the semiconductor device 200 in a top view, FIG. 2(b) shows the semiconductor device 200 in a cross-section view along the direction F-F' as shown in FIG. 2(a), while the FIG. 2(c) shows the semiconductor device 200 in a cross-section view along the direction G-G' as shown in FIG. 2(a).

In embodiments, the semiconductor device 200 includes a substrate 201, an ILD layer 203 above the substrate 201, and the semiconductor device 220 above the ILD layer 203 and within an interconnect structure above the substrate 201. The semiconductor device 220 includes a bottom electrode 221, a channel layer 208 above the bottom electrode 221, and the gate stack 210 above the channel layer 208. A source electrode 207 and a drain electrode 209 are in contact with the channel layer 208, and separated from the gate stack 210 by a spacer 218. The gate stack 210 includes the ferroelectric-oxide layer 212 above the channel layer 208 and in contact with the channel layer 208, a dielectric oxide layer 215 above the ferroelectric-oxide layer 212, and a top electrode 213 above the dielectric oxide layer 215. The ferroelectric-oxide layer 212 includes the domain wall 211. A via 217 is above the top electrode 213 and in contact with a nucleation point 222 of the top electrode 213. The via 217 is contained within an ILD layer 205. A gate contact 225 is above the via 217, in contact with the via 217. Furthermore, the gate stack 210 may be within an ILD layer 204, and the channel 208 is adjacent to a separation area 206.

In embodiments, the nucleation point 222 may be located at one end of the top electrode 213. For example, a distance of the nucleation point 222 to an edge of the top electrode 213 is about less than or equal to 5% of a length of the top electrode 213. The via 217 is in contact with the top electrode 213 at the nucleation point 222. The via 217 has a tip, and a radius of the tip is in a range of about 100 nm to 1 μm.

In embodiments, the domain wall 211 within the ferroelectric-oxide layer 212 is generated by a programming voltage pulse applied to the gate contact 225 coupled to the top electrode 213 through the via 217, while the source electrode 207, the drain electrode 209, and the bottom electrode 221 are grounded. For example, the programming voltage pulse may have a voltage value about 4 voltage, 6 voltage, or 8 voltage. The programming voltage pulse may have a duration from about 10 μs to about 100 ms. The programming voltage values, e.g., 4 voltage, 6 voltage, or 8 voltage, and the duration, e.g., from about 10 μs to about 100 ms, are provided as examples only, and are not limiting. There may be different parameters for the programming voltage values and durations depending on the materials and thickness of the ferroelectric-oxide layer 212.

Figure 2D:
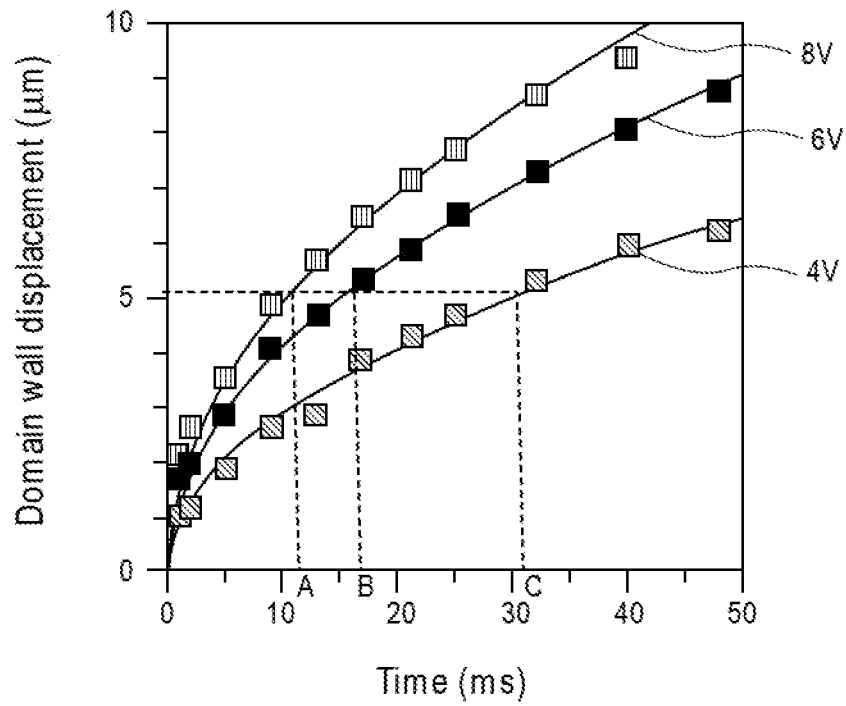

For example, when a programming voltage is of 8 V, the domain wall 111 shown in FIG. 1(d) for the case 153 is generated by a programming voltage pulse of a duration 25 ms. FIG. 2(d) further shows various domain wall displacement from a boundary of the channel layer 208, which is similar to the displacement of the boundary 145 of the domain wall with respect to the boundary 141 of the channel 108, as shown in FIGS. 1(b)-1(d). For example, when a programming voltage of 4V, and a programming voltage pulse of a duration about 31 ms, as shown in point C of FIG. 2(d), is applied to the gate contact 225, there may be a domain wall displacement of about 5 um. Similarly, when a programming voltage of 6V, and a programming voltage pulse of a duration about 17 ms, as shown in point B, is applied to the gate contact 225, there may be a domain wall displacement of about 5 um. Additionally, when a programming voltage of 8V, and a programming voltage pulse of a duration about 11 ms, as shown in point A, is applied to the gate contact 225, there may be a domain wall displacement of about 5 um.

Figure 2E:
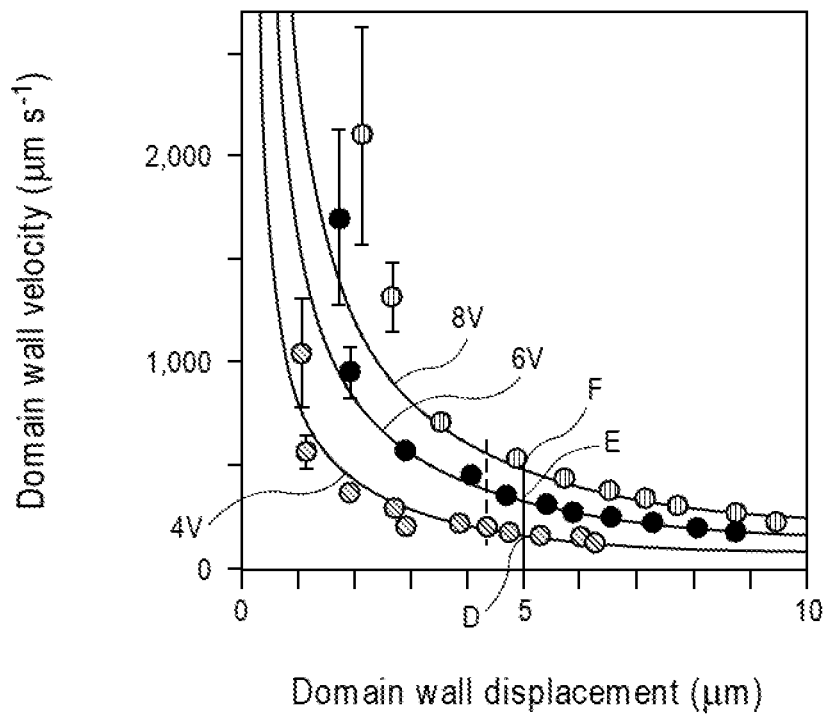

More details of the domain wall 211 displacement velocity is shown in FIG. 2(e). For example, the speed of having a same displacement of the domain wall is faster when a higher programming voltage is applied. For example, in order to have a domain wall displacement of about 5 um, when a programming voltage of 4V, 6V, or 8V is applied to the gate contact 225, the speed of the domain wall displacement may be around 250 um/second as shown in point D, 400 um/second as shown in point E, or 550 um/second as shown in point F.

As demonstrated previously in FIGS. 1(a)-1(d), the position of the domain wall 211 may correspond to a resistance value between the source electrode 207 and the drain electrode 209, which may be a finite length real value within a range. By controlling a programming voltage and a duration of a programming voltage pulse applied to the gate contact 225, different resistance value between the source electrode 207 and the drain electrode 209 can be written into the semiconductor device 200, to store a corresponding finite length real value. On the other hand, the resistance between the source electrode 207 and the drain electrode 209 may be read by some read-circuitry and sensing schemes to convert the resistance values into a current or voltage signals to be integrated into operations of the IC.

Figure 3:
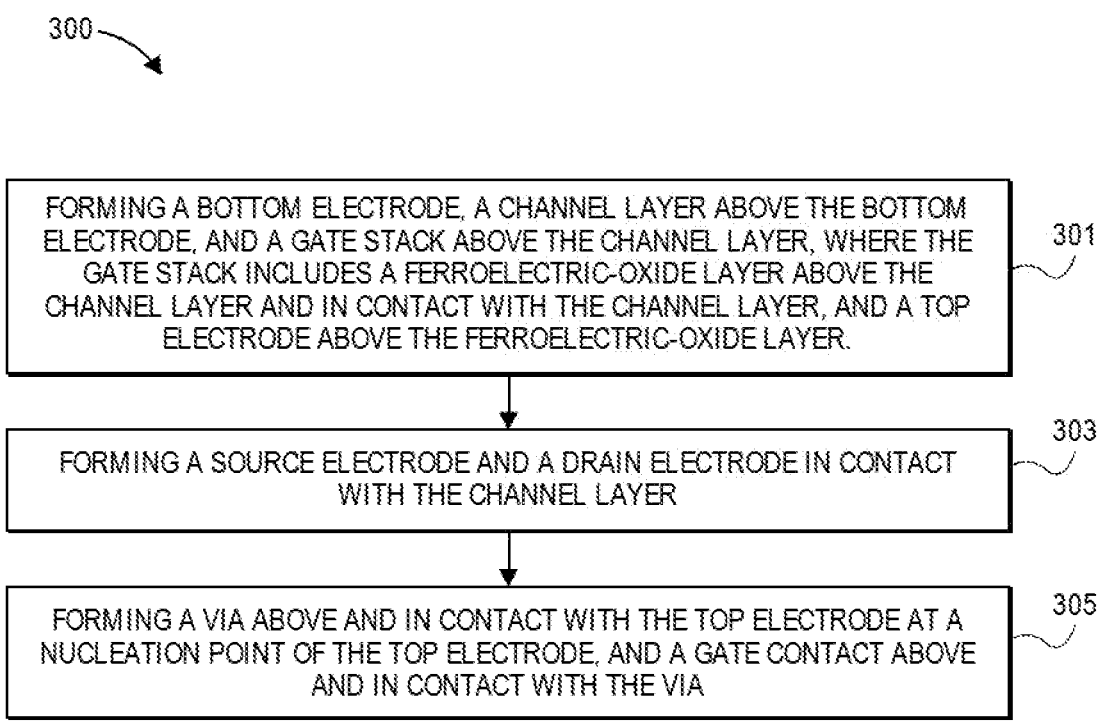
FIG. 3 schematically illustrates a process for forming a semiconductor device having a domain wall within a ferroelectric-oxide layer of a gate stack to store multiple states of resistances, in accordance with some embodiments.

FIG. 3 schematically illustrates a process 300 for forming a semiconductor device having a domain wall within a ferroelectric-oxide layer of a gate stack to store multiple states of resistances, in accordance with some embodiments. In embodiments, the process 200 may be applied to form the semiconductor device 100 as shown in FIGS. 1(a)-1(d), the semiconductor device 200, or the semiconductor device 220 as shown in FIGS. 2(a)-2(c).

At block 301, the process 300 may include forming a bottom electrode, a channel layer above the bottom electrode, and a gate stack above the channel layer, where the gate stack includes a ferroelectric-oxide layer above the channel layer and in contact with the channel layer, and a top electrode above the ferroelectric-oxide layer. For example, as shown in FIG. 2(b), the process 300 may include forming the bottom electrode 221, the channel layer 208 above the bottom electrode 221, and the gate stack 210 above the channel layer 208. The gate stack 210 includes the ferroelectric-oxide layer 212 above the channel layer 208 and in contact with the channel layer 208, and the top electrode 213 above the ferroelectric-oxide layer 212. In more detail, the forming of the gate stack 210 includes forming the ferroelectric-oxide layer 212 above the channel layer 208 and in contact with the channel layer 208, forming the dielectric oxide layer 215 above the ferroelectric-oxide layer 212, and forming the top electrode 213 above the ferroelectric-oxide layer 212 and the dielectric oxide layer 215.

At block 303, the process 300 may include forming a source electrode and a drain electrode in contact with the channel layer. For example, as shown in FIG. 2(c), the process 300 may include forming the source electrode 207 and the drain electrode 209 in contact with the channel layer 208.

At block 305, the process 300 may include forming a via above and in contact with the top electrode at a nucleation point of the top electrode, and a gate contact above and in contact with the via. For example, as shown in FIG. 2(b), the process 300 may include forming the via 217 above and in contact with the top electrode 213 at the nucleation point 222 of the top electrode 213, and the gate contact 225 above and in contact with the via 217.

In addition, the process 300 may include additional operations to form other layers, such as the spacer, ILD layers, not shown.

Figure 4:
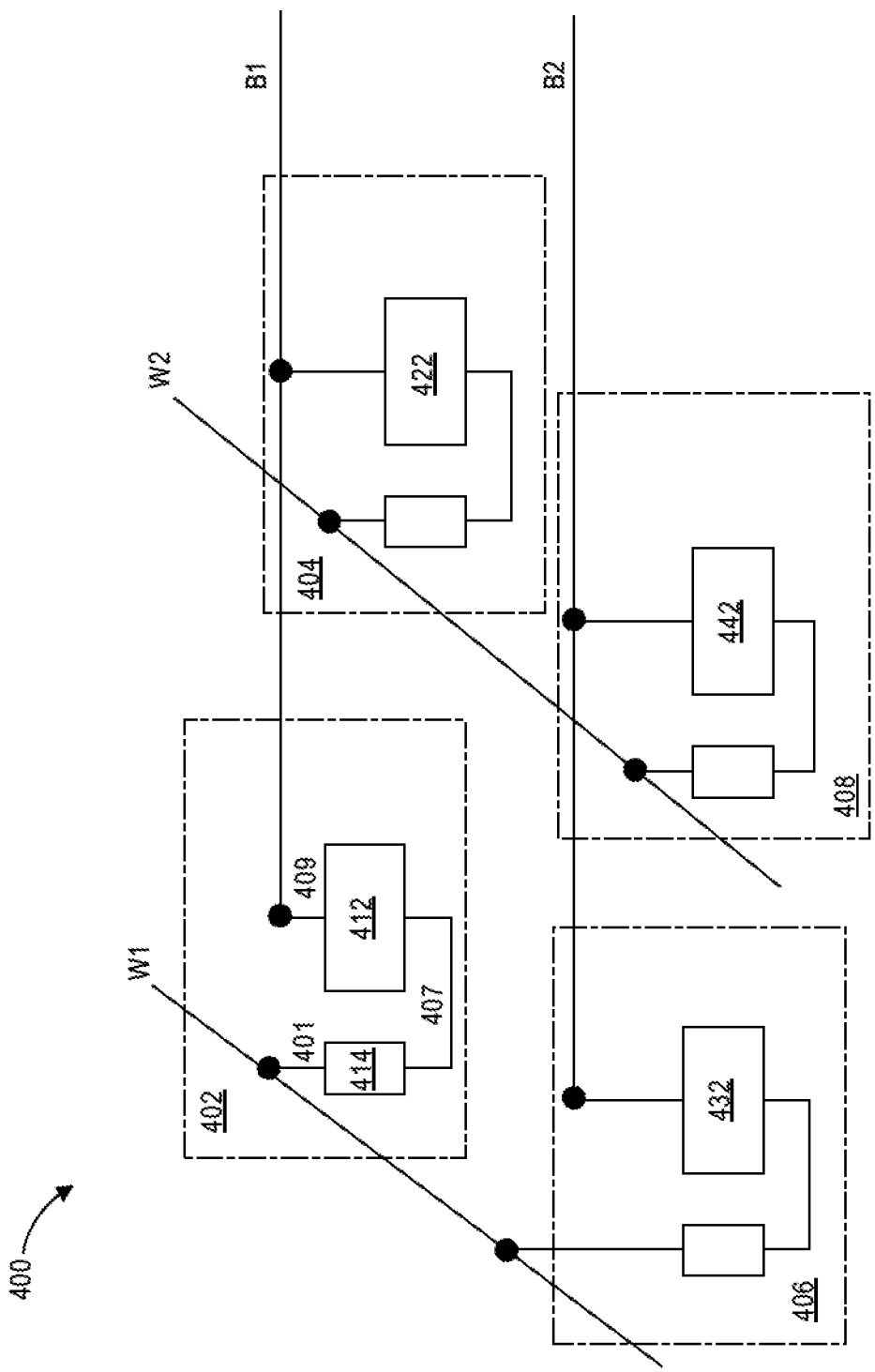
FIG. 4 schematically illustrates a memory array with multiple cells, where a memory cell includes a ferroelectric transistor having a domain wall within a ferroelectric-oxide layer of a gate stack to store multiple states of resistances, in accordance with some embodiments.

FIG. 4 schematically illustrates a memory array 400 with multiple cells, e.g., a memory cell 402, a memory cell 404, a memory cell 406, and a memory cell 408, where a memory cell includes a ferroelectric transistor having a domain wall within a ferroelectric-oxide layer of a gate stack to store multiple states of resistances, in accordance with some embodiments. For example, the memory cell 402 includes a storage cell 412, which may be a ferroelectric transistor. Similarly, the memory cell 404 includes a storage cell 422, the memory cell 406 includes a storage cell 432, and the memory cell 408 includes a storage cell 442. In embodiments, the storage cell 412, the storage cell 422, the storage cell 432, and the storage cell 442 may be similar to the semiconductor device 100 as shown in FIGS. 1(a)-1(d), the semiconductor device 200, the semiconductor device 220 as shown in FIGS. 2(a)-2(c), or a semiconductor device formed following the process 300 as shown in FIG. 3. In embodiments, the multiple memory cells may be arranged in a number of rows and columns coupled by bit lines, e.g., bit line B1 and bit line B2, and word lines, e.g., word line W1 and word line W2.

A memory cell, e.g., the memory cell 402, may be coupled in series with other memory cells, e.g., the memory cell 404, of the same row, and may be coupled in parallel with the memory cells of other rows, e.g., the memory cell 406 and the memory cell 408. The memory array 400 may include any suitable number of one or more memory cells. Although the fuse memory array 400 is shown in FIG. 4 with two rows that each includes two memory cells coupled in series, other embodiments may include other numbers of rows and/or numbers of memory cells within a row. In some embodiments, the number of rows may be different from the number of columns in a fuse memory array. Each row of the fuse memory array may have a same number of memory cells. Additionally, or alternatively, different rows may have different numbers of memory cells.

In embodiments, multiple memory cells, such as the memory cell 402, the memory cell 404, the memory cell 406, and the memory cell 408, may have a similar configuration. For example, the memory cell 402 may include a selector 414 and the storage cell 412. The memory cell 402 may be controlled through the selector 414 coupled to a bit line and a word line to read from the memory cell, write to the memory cell, and/or perform other memory operations. For example, the selector 414 may have an electrode 401 coupled to the word line W1, and the storage cell 412 may have a contact 409 coupled to the bit line B1. In addition, the selector 414 and the storage cell 412 may be coupled together by the electrode 407.

In embodiments, the storage cell 412 may be individually controlled by the selector 414 to write resistance values into the storage 412. For example, the storage cell 412 may include a gate contact coupled to a top electrode through a via, similar to the semiconductor device 200 including the gate contact 225 coupled to the top electrode 213 through the via 217. Through the selector 414, by controlling a programming voltage and a duration of a programming voltage pulse applied to the gate contact of the storage cell 412, a resistance value may be written into the storage cell 412. When the word line W1 is active, the selector 414 may select the storage cell 412. A signal from the word line W1 may pass through the selector 414, further through the storage cell 412, and reaching the other electrode, which is the bit line B1.

Figure 5:
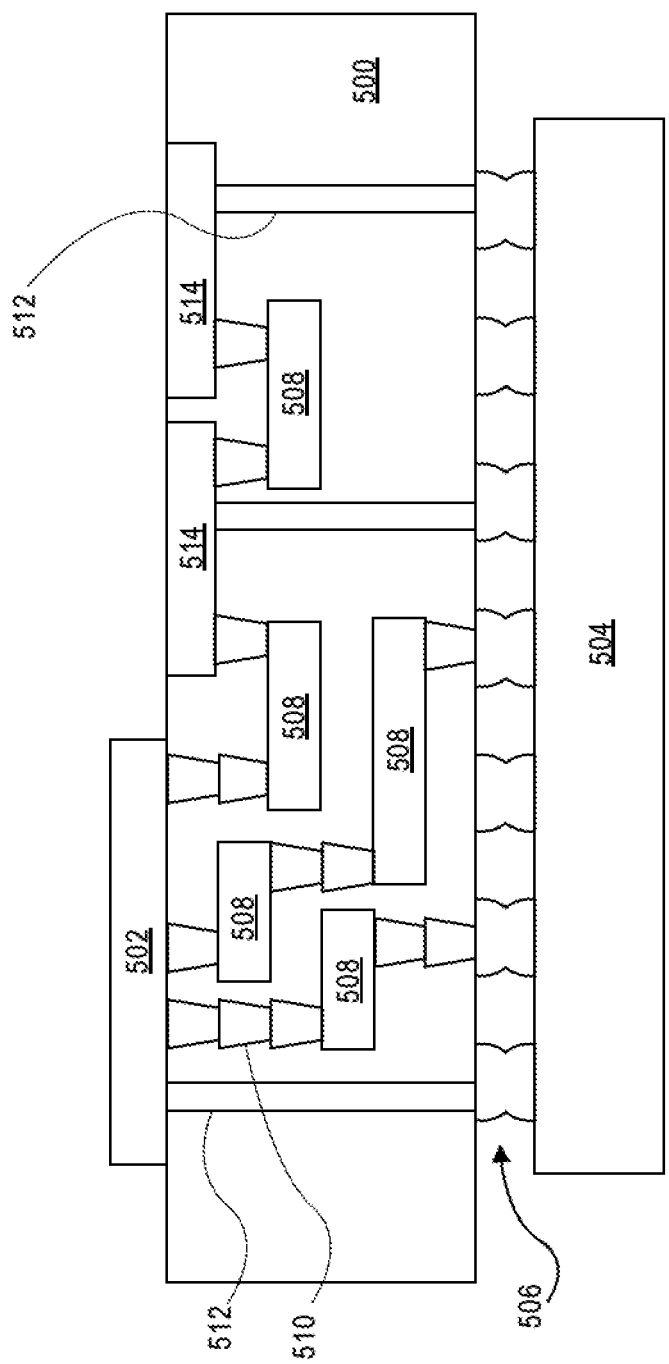
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for a semiconductor device, e.g., the semiconductor device 100 as shown in FIGS. 1(a)-1(d), the semiconductor device 200, the semiconductor device 220 as shown in FIGS. 2(a)-2(c), or a semiconductor device formed following the process 300 as shown in FIG. 3. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
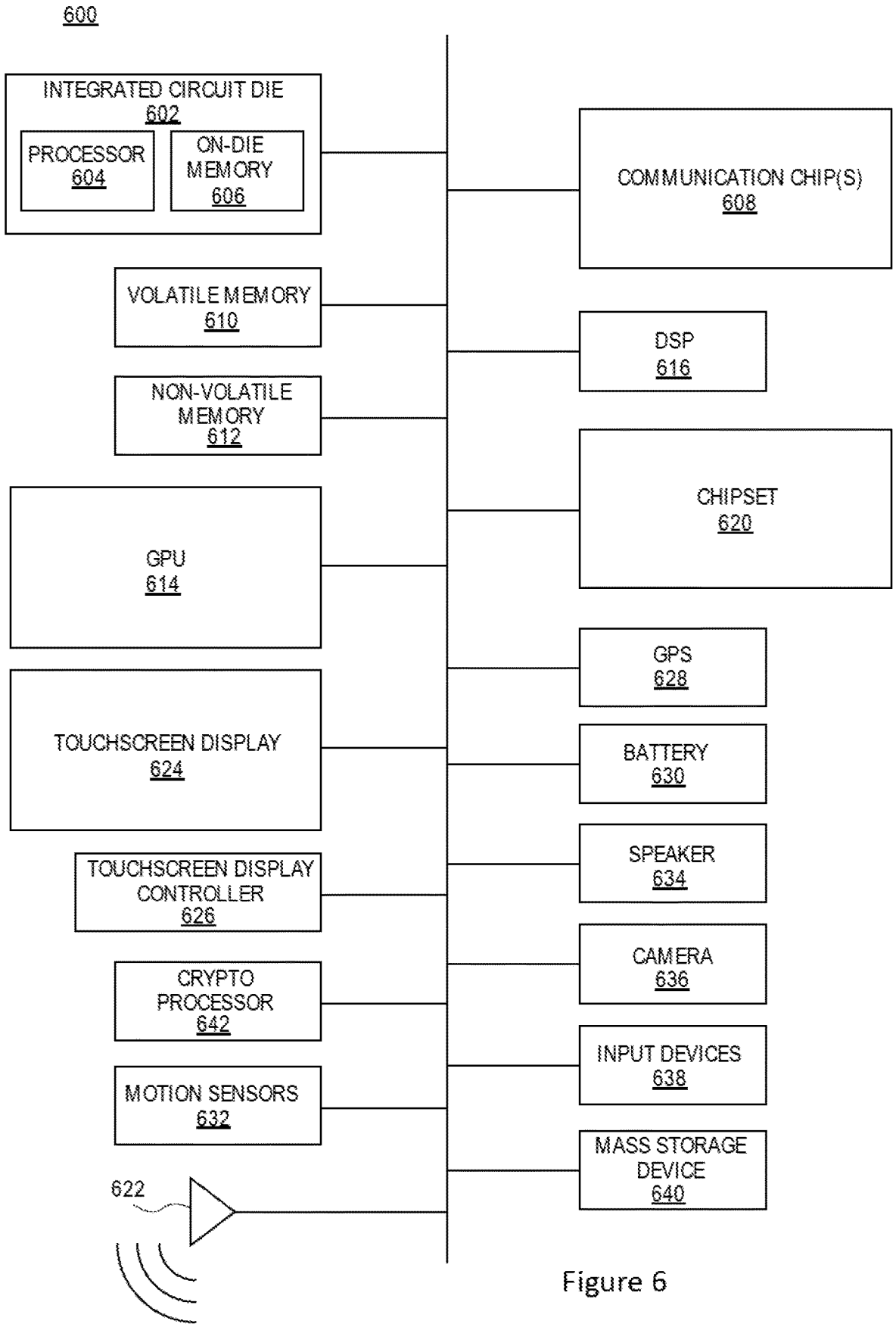
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the processor 604 as well as the on-die memory 606 may include the semiconductor device 100 as shown in FIGS. 1(a)-1(d), the semiconductor device 200, the semiconductor device 220 as shown in FIGS. 2(a)-2(c), or a semiconductor device formed following the process 300 as shown in FIG. 3.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the semiconductor device 100 as shown in FIGS. 1(a)-1(d), the semiconductor device 200, the semiconductor device 220 as shown in FIGS. 2(a)-2(c), or a semiconductor device formed following the process 300 as shown in FIG. 3.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a semiconductor device, comprising: a channel layer above a bottom electrode, including a first portion and a second portion of the channel layer, wherein the first portion is in an ON state, the second portion is in an OFF state, the first portion is separated from the second portion by a separation line in a horizontal direction from a source electrode of a ferroelectric transistor to a drain electrode of the ferroelectric transistor; a gate stack above the channel layer, wherein the gate stack includes: a ferroelectric-oxide layer above the channel layer and in contact with the channel layer, and a top electrode above the ferroelectric-oxide layer, wherein the top electrode includes a nucleation point, the ferroelectric-oxide layer includes a domain wall between an area under the nucleation point of the top electrode and above the separation line of the channel layer, and over the first portion of the channel layer; and wherein a resistance between the source electrode and the drain electrode of the ferroelectric transistor is modulated in a range between a first resistance value and a second resistance value, dependent on a position of the domain wall within the ferroelectric-oxide layer of the gate stack, a position of the first portion of the channel layer, and a position of the second portion of the channel layer.

Example 2 may include the semiconductor device of example 1 and/or some other examples herein, wherein the first resistance value is a resistance value between the source electrode and the drain electrode of the ferroelectric transistor when the channel layer is entirely in the OFF state, the first portion of the channel layer is empty; and the second resistance value is a resistance value between the source electrode and the drain electrode of the ferroelectric transistor when the channel layer is entirely in the ON state, the second portion of the channel layer is empty.

Example 3 may include the semiconductor device of example 2 and/or some other examples herein, wherein the first resistance value is in a range of about 100 ohms/um to about 1000 ohms/um, and the second resistance value is in a range of about $10^9$ ohms/um to about $10*10^9$ ohms/um.

Example 4 may include the semiconductor device of example 2 and/or some other examples herein, wherein the channel layer includes multiple fins, and the first portion or the second portion of the channel layer includes one or more fins.

Example 5 may include the semiconductor device of example 1 and/or some other examples herein, wherein the ferroelectric-oxide layer includes Pb, Zr, Ti, Ba, Sr, or Hf.

Example 6 may include the semiconductor device of example 1 and/or some other examples herein, wherein the gate stack further includes a dielectric oxide layer above the ferroelectric-oxide layer, and below the top electrode.

Example 7 may include the semiconductor device of example 6 and/or some other examples herein, wherein the dielectric oxide layer includes $SiO_2$, $Al_2O_3$, or $HfO_2$.

Example 8 may include the semiconductor device of example 1 and/or some other examples herein, wherein the bottom electrode or the top electrode includes $SrRuO_3$, Pt, W, Ru, Co, TiN, Ta, TaN, Cu, Cr, Mo, Pd.

Example 9 may include the semiconductor device of example 1 and/or some other examples herein, wherein the nucleation point is located at one end of the top electrode of the gate stack, and a distance of the nucleation point to an edge of the top electrode is about less than or equal to 5% of a length of the top electrode.

Example 10 may include the semiconductor device of example 1 and/or some other examples herein, further comprising: the bottom electrode below the channel layer; a via above and in contact with the top electrode at the nucleation point of the top electrode; and a gate contact above and in contact with the via.

Example 11 may include the semiconductor device of example 10 and/or some other examples herein, wherein the via has a tip, and a radius of the tip is in a range of about 100 nm to 1 μm.

Example 12 may include the semiconductor device of example 10 and/or some other examples herein, wherein the domain wall within the ferroelectric-oxide layer is generated by a programming voltage pulse applied to the gate contact coupled to the top electrode through the via, while the source electrode, the drain electrode, and the bottom electrode are grounded.

Example 13 may include the semiconductor device of example 12 and/or some other examples herein, wherein the programming voltage pulse has a voltage value about 4 voltage, 6 voltage, or 8 voltage.

Example 14 may include the semiconductor device of example 12 and/or some other examples herein, wherein the programming voltage pulse has a duration from about 10 μs to about 100 ms.

Example 15 may include the semiconductor device of example 1 and/or some other examples herein, wherein the source electrode or the drain electrode includes Ti, W, molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 16 may include the semiconductor device of example 1 and/or some other examples herein, wherein the bottom electrode is a substrate, and the substrate includes a silicon substrate, a glass substrate, a metal substrate, a substrate including and $SiO_2$, or a plastic substrate.

Example 17 may include the semiconductor device of example 1 and/or some other examples herein, wherein the source electrode, the drain electrode, and the gate stack are within an interconnect structure above a substrate.

Example 18 may include a method for forming a semiconductor device, the method comprising: forming a bottom electrode; forming a channel layer above the bottom electrode; forming a gate stack above the channel layer, wherein the gate stack includes a ferroelectric-oxide layer above the channel layer and in contact with the channel layer, and a top electrode above the ferroelectric-oxide layer; forming a via above and in contact with the top electrode at a nucleation point of the top electrode; forming a gate contact above and in contact with the via; and forming a source electrode and a drain electrode in contact with the channel layer; wherein a domain wall within the ferroelectric-oxide layer is to be generated by a programming voltage pulse applied to the gate contact coupled to the top electrode through the via, while the source electrode, the drain electrode, and the bottom electrode are grounded; the channel layer includes a first portion under the domain wall within the ferroelectric-oxide layer to be in an ON state, and a second portion not overlapped with the domain wall to be in an OFF state, the first portion is separated from the second portion by a separation line in a horizontal direction from the source electrode to the drain electrode.

Example 19 may include the method of example 18 and/or some other examples herein, wherein the forming the gate stack above the channel layer includes: forming the ferroelectric-oxide layer above the channel layer and in contact with the channel layer; and forming the top electrode above the ferroelectric-oxide layer.

Example 20 may include the method of example 19 and/or some other examples herein, wherein the forming the gate stack above the channel layer further includes: forming a dielectric oxide layer above the ferroelectric-oxide layer, and below the top electrode.

Example 21 may include the method of example 18 and/or some other examples herein, wherein: a resistance between the source electrode and the drain electrode is modulated in a range between a first resistance value and a second resistance value, dependent on a position of the domain wall within the ferroelectric-oxide layer of the gate stack, a position of the first portion of the channel layer, and a position of the second portion of the channel layer; the first resistance value is a resistance value between the source electrode and the drain electrode of the ferroelectric transistor when the channel layer is entirely in the OFF state, the first portion of the channel layer is empty; and the second resistance value is a resistance value between the source electrode and the drain electrode of the ferroelectric transistor when the channel layer is entirely in the ON state, the second portion of the channel layer is empty.

Example 22 may include the method of example 18 and/or some other examples herein, wherein the channel layer includes multiple fins, and the first portion or the second portion of the channel layer includes one or more fins; the ferroelectric-oxide layer includes Pb, Zr, Ti, Ba, Sr, or Hf; the nucleation point is located at one end of the top electrode of the gate stack, and a distance of the nucleation point to an edge of the top electrode is about less than or equal to 5% of a length of the top electrode; and the via has a tip, and a radius of the tip is in a range of about 100 nm to 1 μm.

Example 23 may include a computing device, comprising: a circuit board; and a memory device coupled to the circuit board and including a memory array, wherein the memory array includes a plurality of memory cells, a memory cell of the plurality of memory cells includes a ferroelectric transistor, and the ferroelectric transistor includes: a bottom electrode; a channel layer above a bottom electrode, including a first portion and a second portion of the channel layer, wherein the first portion is in an ON state, the second portion is in an OFF state, the first portion is separated from the second portion by a separation line in a horizontal direction from a source electrode to a drain electrode; a gate stack above the channel layer, wherein the gate stack includes a ferroelectric-oxide layer above the channel layer and in contact with the channel layer, and a top electrode above the ferroelectric-oxide layer; a via above and in contact with the top electrode at a nucleation point of the top electrode, wherein the ferroelectric-oxide layer includes a domain wall between an area under the nucleation point of the top electrode and above the separation line of the channel layer, and over the first portion of the channel layer; and a gate contact above and in contact with the via; wherein a resistance between the source electrode and the drain electrode is modulated in a range between a first resistance value and a second resistance value, dependent on a position of the domain wall within the ferroelectric-oxide layer of the gate stack, a position of the first portion of the channel layer, and a position of the second portion of the channel layer.

Example 24 may include the computing device of example 23 and/or some other examples herein, wherein the channel layer includes multiple fins, and the first portion or the second portion of the channel layer includes one or more fins; the ferroelectric-oxide layer includes Pb, Zr, Ti, Ba, Sr, or Hf; the nucleation point is located at one end of the top electrode of the gate stack, and a distance of the nucleation point to an edge of the top electrode is about less than or equal to 5% of a length of the top electrode; and the via has a tip, and a radius of the tip is in a range of about 100 nm to 1 µm.

Example 25 may include the computing device of example 23 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
    a channel layer above a bottom electrode, including a first portion and a second portion of the channel layer, wherein the first portion is in an ON state, the second portion is in an OFF state, the first portion is separated from the second portion by a separation line in a horizontal direction from a source electrode of a ferroelectric transistor to a drain electrode of the ferroelectric transistor;
    a gate stack above the channel layer, wherein the gate stack includes:
        a ferroelectric-oxide layer above the channel layer and in contact with the channel layer, and
        a top electrode above the ferroelectric-oxide layer, wherein the top electrode includes a nucleation point, the ferroelectric-oxide layer includes a domain wall between an area under the nucleation point of the top electrode and above the separation line of the channel layer, and the domain wall over the first portion of the channel layer but not over the second portion of the channel layer; and
    wherein a resistance between the source electrode and the drain electrode of the ferroelectric transistor is modulated in a range between a first resistance value and a second resistance value, dependent on a position of the domain wall within the ferroelectric-oxide layer of the gate stack, a position of the first portion of the channel layer, and a position of the second portion of the channel layer.

2. The semiconductor device of claim 1, wherein the first resistance value is a resistance value between the source electrode and the drain electrode of the ferroelectric transistor when the channel layer is entirely in the OFF state, the first portion of the channel layer is empty; and
    the second resistance value is a resistance value between the source electrode and the drain electrode of the ferroelectric transistor when the channel layer is entirely in the ON state, the second portion of the channel layer is empty.

3. The semiconductor device of claim 2, wherein the first resistance value is in a range of about 100 ohms/um to about 1000 ohms/um, and the second resistance value is in a range of about $10^9$ ohms/um to about $10*10^9$ ohms/um.

4. The semiconductor device of claim 2, wherein the channel layer includes multiple fins, and the first portion or the second portion of the channel layer includes one or more fins.

5. The semiconductor device of claim 1, wherein the ferroelectric-oxide layer includes Pb, Zr, Ti, Ba, Sr, or Hf.

6. The semiconductor device of claim 1, wherein the gate stack further includes a dielectric oxide layer above the ferroelectric-oxide layer, and below the top electrode.

7. The semiconductor device of claim 6, wherein the dielectric oxide layer includes $SiO_2$, $Al_2O_3$, or $HfO_2$.

8. The semiconductor device of claim 1, wherein the bottom electrode or the top electrode includes SrRuO3, Pt, W, Ru, Co, TiN, Ta, TaN, Cu, Cr, Mo, Pd.

9. The semiconductor device of claim 1, wherein the nucleation point is located at one end of the top electrode of the gate stack, and a distance of the nucleation point to an edge of the top electrode is about less than or equal to 5% of a length of the top electrode.

10. The semiconductor device of claim 1, further comprising:
    the bottom electrode below the channel layer;
    a via above and in contact with the top electrode at the nucleation point of the top electrode; and
    a gate contact above and in contact with the via.

11. The semiconductor device of claim 10, wherein the via has a tip, and a radius of the tip is in a range of about 100 nm to 1 µm.

12. The semiconductor device of claim 10, wherein the domain wall within the ferroelectric-oxide layer is generated by a programming voltage pulse applied to the gate contact coupled to the top electrode through the via, while the source electrode, the drain electrode, and the bottom electrode are grounded.

13. The semiconductor device of claim 12, wherein the programming voltage pulse has a voltage value about 4 volts, 6 volts, or 8 volts.

14. The semiconductor device of claim 12, wherein the programming voltage pulse has a duration from about 10 µs to about 100 ms.

15. The semiconductor device of claim 1, wherein the source electrode or the drain electrode includes Ti, W, molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

16. The semiconductor device of claim 1, wherein the bottom electrode is a substrate, and the substrate includes a silicon substrate, a glass substrate, a metal substrate, a substrate including and $SiO_2$, or a plastic substrate.

17. The semiconductor device of claim 1, wherein the source electrode, the drain electrode, and the gate stack are within an interconnect structure above a substrate.

18. A method for forming a semiconductor device, the method comprising:
forming a bottom electrode;
forming a channel layer above the bottom electrode;
forming a gate stack above the channel layer, wherein the gate stack includes a ferroelectric-oxide layer above the channel layer and in contact with the channel layer, and a top electrode above the ferroelectric-oxide layer;
forming a via above and in contact with the top electrode at a nucleation point of the top electrode;
forming a gate contact above and in contact with the via; and
forming a source electrode and a drain electrode in contact with the channel layer;
wherein a domain wall within the ferroelectric-oxide layer is to be generated by a programming voltage pulse applied to the gate contact coupled to the top electrode through the via, while the source electrode, the drain electrode, and the bottom electrode are grounded; the channel layer includes a first portion under the domain wall within the ferroelectric-oxide layer to be in an ON state, and a second portion not overlapped with the domain wall to be in an OFF state, the first portion is separated from the second portion by a separation line in a horizontal direction from the source electrode to the drain electrode.

19. The method of claim 18, wherein the forming the gate stack above the channel layer includes:
forming the ferroelectric-oxide layer above the channel layer and in contact with the channel layer; and
forming the top electrode above the ferroelectric-oxide layer.

20. The method of claim 19, wherein the forming the gate stack above the channel layer further includes:
forming a dielectric oxide layer above the ferroelectric-oxide layer, and below the top electrode.

21. The method of claim 18, wherein:
a resistance between the source electrode and the drain electrode is modulated in a range between a first resistance value and a second resistance value, dependent on a position of the domain wall within the ferroelectric-oxide layer of the gate stack, a position of the first portion of the channel layer, and a position of the second portion of the channel layer;
the first resistance value is a resistance value between the source electrode and the drain electrode of the ferroelectric transistor when the channel layer is entirely in the OFF state, the first portion of the channel layer is empty; and
the second resistance value is a resistance value between the source electrode and the drain electrode of the ferroelectric transistor when the channel layer is entirely in the ON state, the second portion of the channel layer is empty.

22. The method of claim 18, wherein the channel layer includes multiple fins, and the first portion or the second portion of the channel layer includes one or more fins;
the ferroelectric-oxide layer includes Pb, Zr, Ti, Ba, Sr, or Hf;
the nucleation point is located at one end of the top electrode of the gate stack, and a distance of the nucleation point to an edge of the top electrode is about less than or equal to 5% of a length of the top electrode; and
the via has a tip, and a radius of the tip is in a range of about 100 nm to 1 µm.

23. A computing device, comprising: a circuit board; and a memory device coupled to the circuit board and including a memory array, wherein the memory array includes a plurality of memory cells, a memory cell of the plurality of memory cells includes a ferroelectric transistor, and the ferroelectric transistor includes: a bottom electrode; a channel layer above a bottom electrode, including a first portion and a second portion of the channel layer, wherein the first portion is in an ON state, the second portion is in an OFF state, the first portion is separated from the second portion by a separation line in a horizontal direction from a source electrode to a drain electrode; a gate stack above the channel layer, wherein the gate stack includes a ferroelectric-oxide layer above the channel layer and in contact with the channel layer, and a top electrode above the ferroelectric-oxide layer; a via above and in contact with the top electrode at a nucleation point of the top electrode, wherein the ferroelectric-oxide layer includes a domain wall between an area under the nucleation point of the top electrode and above the separation line of the channel layer, and the domain wall over the first portion of the channel layer but not over the second portion of the channel layer; and a gate contact above and in contact with the via; wherein a resistance between the source electrode and the drain electrode is modulated in a range between a first resistance value and a second resistance value, dependent on a position of the domain wall within the ferroelectric-oxide layer of the gate stack, a position of the first portion of the channel layer, and a position of the second portion of the channel layer.

24. The computing device of claim 23, wherein the channel layer includes multiple fins, and the first portion or the second portion of the channel layer includes one or more fins;
the ferroelectric-oxide layer includes Pb, Zr, Ti, Ba, Sr, or Hf;
the nucleation point is located at one end of the top electrode of the gate stack, and a distance of the nucleation point to an edge of the top electrode is about less than or equal to 5% of a length of the top electrode; and
the via has a tip, and a radius of the tip is in a range of about 100 nm to 1 µm.

25. The computing device of claim 23, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *